United States Patent [19]

Stedtnitz

[11] Patent Number: 4,648,079
[45] Date of Patent: Mar. 3, 1987

[54] METHOD OF TROUBLESHOOTING AN UNDERWATER ACOUSTIC TRANSDUCER ARRAY

[75] Inventor: Wolfgang Stedtnitz, Stuhr, Fed. Rep. of Germany

[73] Assignee: Fried. Krupp Gesellschaft mit beschränkter Haftung, Essen, Fed. Rep. of Germany

[21] Appl. No.: 622,742

[22] Filed: Jun. 20, 1984

[30] Foreign Application Priority Data

Jun. 24, 1983 [DE] Fed. Rep. of Germany ....... 3322765

[51] Int. Cl.$^4$ ........................................... H04R 29/00
[52] U.S. Cl. .................................................... 367/13
[58] Field of Search .......................................... 367/13

[56] References Cited

U.S. PATENT DOCUMENTS

| | | | |
|---|---|---|---|
| 4,296,483 | 10/1981 | Haill | 367/13 |
| 4,298,969 | 11/1981 | Rickenbacker | 367/13 |
| 4,380,808 | 4/1983 | Hill et al. | 367/153 |

*Primary Examiner*—Richard A. Farley
*Attorney, Agent, or Firm*—Spencer & Frank

[57] ABSTRACT

A method for troubleshooting an underwater acoustic transducer array comprising a plurality of transducers so as to test the operationally installed underwater transducer array on board for its operational reliability and to be able to localize malfunctioning transducers. For this purpose, a sinusoidal test signal, preferably the transmitted signal itself, is fed through a connecting line into the transducer array from a location remote from the transducer array and the current flowing through the transducers is detected by at least two samplings as the real component and the imaginary component with respect to the test signal. The sampling values are transmitted back to the remote location and the admittance of each transducer is determined from the ratio of the real component and of the imaginary component of the current to the test signal amplitude. A significant deviation from the known admittance at the test signal frequency is interpreted as a transducer malfunction.

24 Claims, 5 Drawing Figures

| ADDRESS GENERATOR 35 | | | | | | | | NUMBER OF THE RESPECTIVE INPUT OF MUX 33 CONNECTED WITH THE OUTPUT | CONTROL PULSE GEN. 34 | | | |
|---|---|---|---|---|---|---|---|---|---|---|---|---|
| BIT OCCUPATION AT OUTPUTS $Q_1$–$Q_8$ OF BINARY COUNTER 35 | | | | | | | | | CONTROL PULSE AT THE INHIBIT INPUT WITH THE REFERENCE VOLTAGE IN $\alpha°$ PHASE POSITION $\alpha =$ | | | |
| $Q_1$ | $Q_2$ | $Q_3$ | $Q_4$ | $Q_5$ | $Q_6$ | $Q_7$ | $Q_8$ | | 0° | 90° | 180° | 270° |
| H | L | L | L | L | L | L | L | 0 | X | | | |
| L | L | L | L | L | L | L | L | 0 | X | | | |
| H | H | L | L | L | L | L | L | 0 | | | X | |
| L | H | L | L | L | L | L | L | 0 | | | X | |
| H | L | H | L | L | L | L | L | 1 | X | | | |
| L | L | H | L | L | L | L | L | 1 | X | | | |
| H | H | H | L | L | L | L | L | 1 | | | X | |
| L | H | H | L | L | L | L | L | 1 | | | X | |
| . | . | . | H | L | . | . | . | 2 | X | | | |
| . | . | . | . | . | . | . | . | 2 | X | | | |
| . | . | . | . | . | . | . | . | . | | | | |
| H | H | H | H | H | H | L | L | 15 | | | X | |
| L | H | H | H | H | H | L | L | 15 | | | X | |
| H | L | L | L | L | L | H | L | 0 | | X | | |
| L | L | L | L | L | L | H | L | 0 | | X | | |
| H | H | L | L | L | L | H | L | 0 | | | | X |
| L | H | L | L | L | L | H | L | 0 | | | | X |
| H | L | H | L | L | L | H | L | 1 | | X | | |
| L | L | H | L | L | L | H | L | 1 | | X | | |
| H | H | H | L | L | L | H | L | 1 | | | | X |
| L | H | H | L | L | L | H | L | 1 | | | | X |
| . | . | . | . | . | . | . | . | 2 | | | | |
| . | . | . | . | . | . | . | . | 2 | | | | |
| . | . | . | . | . | . | . | . | . | | | | |
| H | H | H | H | H | H | H | L | 15 | | | | X |
| L | H | H | H | H | H | H | L | 15 | | | | X |
| H | L | L | L | L | L | L | H | | | | | |

Arrows at bottom:
- $Q_1$: CONTROL BIT FOR MUX 39
- $Q_2$–$Q_6$: ADDRESS BITS FOR MUX 33
- $Q_7$: CONTROL BIT FOR MUX 39
- $Q_8$: CLEAR BIT FOR ADDRESS GENERATOR 35

FIG. 4

METHOD OF TROUBLESHOOTING AN UNDERWATER ACOUSTIC TRANSDUCER ARRAY

BACKGROUND OF THE INVENTION

The present invention relates to a method for troubleshooting an underwater acoustic transducer array, which comprises a plurality of spatially juxtaposed hydroacoustic transducers or groups of transducers, and is connected, via an electrical connection line, with a spatially remotely disposed transmitter and/or receiver. The transducers or groups of transducers, each comprising a plurality of individual transducers, are generally sealed, e.g. potted, and encased in an enveloping body which may be made of one piece with the sealing mass. The present invention also relates to an apparatus for carrying out the method of the invention.

Underwater transducer arrays of the above type cannot be tested when they are installed on board a ship. If there is a suspicion of malfunction, the entire underwater transducer array must be dismantled and checked at the factory by measuring its directional characteristic. On the basis of a comparison between desired and actual directional characteristics, it is then possible to approximately localize a malfunctioning transducer which can then be replaced after the underwater antenna has been disassembled. However, measuring the directional characteristic is still subject to very high measuring inaccuracies so that frequently a plurality of transducers must be taken out and checked separately before the actually malfunctioning transducer is detected. Such dismantling of a transducer or group of transducers is very time consuming and cost intensive.

SUMMARY OF THE INVENTION

It is the object of the present invention to provide a method for troubleshooting underwater acoustic transducer arrays by means of which underwater acoustic transducer arrays of the above-mentioned type can be checked for malfunctions while installed on board a ship, and all transducers or groups of transducers can be checked individually for their operational reliability.

The above object is generally accomplished according to the invention by a method for troubleshooting an underwater acoustic transducer array of the type including a purality of spatially juxtaposed, hydroacoustic transducers or transducer groups which is connected, by an electrical connecting line, with a spatially remotely disposed transmitter and/or receiver, wherein: at least one essentially sinusoidal test signal at a given frequency is at least temporarily fed to the transducer array through the connecting line; the current flowing through each transducer or each transducer group, or a value proportional thereto, is sampled at least twice directly at each transducer or transducer group, namely at least once when the test signal present at the antenna input takes on an extreme value i.e., a maximum or a minimum, and at least once shifted by (4n+1) times one quarter period of the test signal, with n being any desired whole number starting with zero; the sample values are transmitted back sequentially through the connecting line; the respective sampling values are brought into ratio relationships with the extreme value of the test signal; and the admittance of the respective transducer or transducer group, or a value proportional thereto, is determined at the test signal frequency with the thus obtained at least two ratios.

Figure 1:
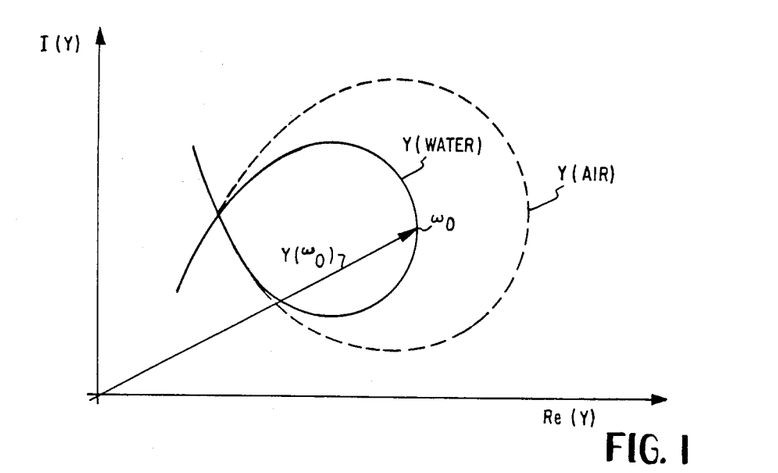
FIG. 1 is a graphic representation of the admittance (Y) locus curve of a transducer in water (solid line) and in air (dashed line).

The method according to the present invention takes advantage of the fact that, as shown in FIG. 1, the admittance locus of a transducer or group of transducers is greater when radiated in air than in water or in the plastic enclosing the transducers. If now the coupling of the transducer to the water or to the plastic becomes faulty, e.g. due to the adhesive bond between the ceramic material and the encasing plastic coming loose, the admittance of the transducer changes significantly. According to the method fo the invention, the admittance of each transducer or group of transducers, or a value proportional thereto, is now determined and, from a change in admittance between the desired admittance and the actual admittance, a conclusion is drawn as to the presence of a transducer malfunction.

A determination of the admittance is made in that the respective transducer current or transducer group current, is measured with respect to the test signal at at least two sampling times, namely at least once at the moment when the magnitude of the test signal takes on an extreme value i.e., a maximum or a minimum, and at least once at a time which is shifted by one quarter period of the test signal. Due to the periodicity of the test signal, the second sampling point may also be shifted by one quarter period plus a whole number multiple of the period of the test signal. With these two samples, the real component, i.e., the in-phase component, and the imaginary component of the transducer current or transducer group current is detected. If the ratio of these sampled current values to the maximum amplitude of the test signal are now formed, the real (RE) and imaginary (Im) components of the admittance (Y) of the transducer or group of transducers, results. Vectorial addition of these real and imaginary admittance components provides the admittance of the transducer, or group of transducers, according to magnitude and phase for the frequency of the test signal.

According to an advantageous feature of the method according to the invention, instead of using the transmitted test signal directly to control the sampling times for the transducer current and for determining the admittances, a reference voltage which is proportional to and rigidly in-phase with the test signal is derived from the test signal and the sampling of the transducer currents is synchronized with this reference voltage. The reference voltage is itself sampled in the same manner and the sampled values of the reference signal transmitted back to the remote location where the greatest sampling value of the reference signal with respect to magnitude is used, instead of the extreme value of the test signal, to obtain the admittance ratios. The reference voltage according to the invention and its identical sampling permits detection of the test signal voltage across the input of the underwater acoustic transducer array or a value proportional thereto and in real and imaginary components. Since the sampling of the reference voltage takes place at the maximum and/or minimum of the reference voltage and with a phase shift of one quarter period thereto, the largest magnitude of the sample values of the reference signal is always the real component, while the smaller magnitude of the sample values represents the imaginary portion which, with phase correct sampling, is zero. By using the real component of the reference voltage obtained at the transducer array input for the admittance determination, errors resulting from line attenuations in the connecting lines are eliminated. The imaginary component of the reference voltage serves only as a check for phase correct sampling.

According to a further advantageous feature of the method according to the invention the transducer current (or the value proportional to the current) and the reference voltage are sampled at least twice more, each shifted in phase by one half-period of the reference voltage with respect to the first two samplings, and the differences with respect to one another between the initial sampling values and the samplings shifted by one-half period for the transducer current (or the current proportional value) and the reference voltage, respectively, are used to determine the ratios. Due to the at least four phase correct samplings of the transducer current, or the transducer group current, and the determination of the admittance from the differences between the respectively associated sampling values, possibly existing offset voltages are eliminated and do not falsify the measuring result.

According to still a further advantageous feature of the method according to the invention, a value proportional to the transducer or transducer group current is sampled with this sampled current proportional value being the voltage drop across a load through which at least part of the transducer current or transducer group current flows, and whose effective resistance or reactance is preferably zero. With this measure, the current flowing through the transducer, or through the group of transducers, can be detected for measuring in a simple manner.

Finally, according to a still further advantageous feature of the method according to the invention, if the transducer array is an underwater acoustic transducer array operating as a transmitting array, the transmitted signals are simultaneously used as the test signals. With this measure, the underwater acoustic transducer array can be tested in on-line operation and can thus be monitored constantly. The generation of a separate test signal and the provision of a separate test signal generator is no longer required. Underwater acoustic transducer arrays having staggered amplitude and/or phase shifted transducer combinations can be measured with respect to their individual transducers with the same good troubleshooting results.

An advantageous apparatus for implementing the method according to the present invention comprises: a test signal generator which is connected to the underwater acoustic transducer array by means of a multiconductor connecting line; respective measuring elements connected in series with the transducers or transducer groups, and preferably having a negligibly low reactance or effective resistance, e.g., a resistor, capacitor or the like; a voltage divider which is connected in parallel with the series connections of respective measuring elements and transducers or transducer groups for generating the reference voltage; a sampling value holding member whose output is connected to the connecting line; a signal pickup which sequentially samples the voltage drops across the voltage divider and the measuring elements, and whose output is connected with the input of the sampling value holding member; and a pickup synchronizing device which synchronizes the signal pickup with the reference voltage such that momentary voltage values of the voltage appearing across the voltage divider and across the respective measuring elements appear in succession at the sampling value holding member, at least once in a first sampling cycle whenever the reference voltage reaches a maximum and/or a minimum and, at least once in a second sampling cycle which is shifted by (4n+1) times quarter period of the reference voltage, with n being any desired whole number starting with zero.

The present invention will now be described in greater detail with the aid of an embodiment, as illustrated in the drawing figures, of an apparatus for troubleshooting an underwater acoustic transducer array.

DETAILED DESCRIPTION OF THE PREFERRED EMBODIMENTS

Figure 2:
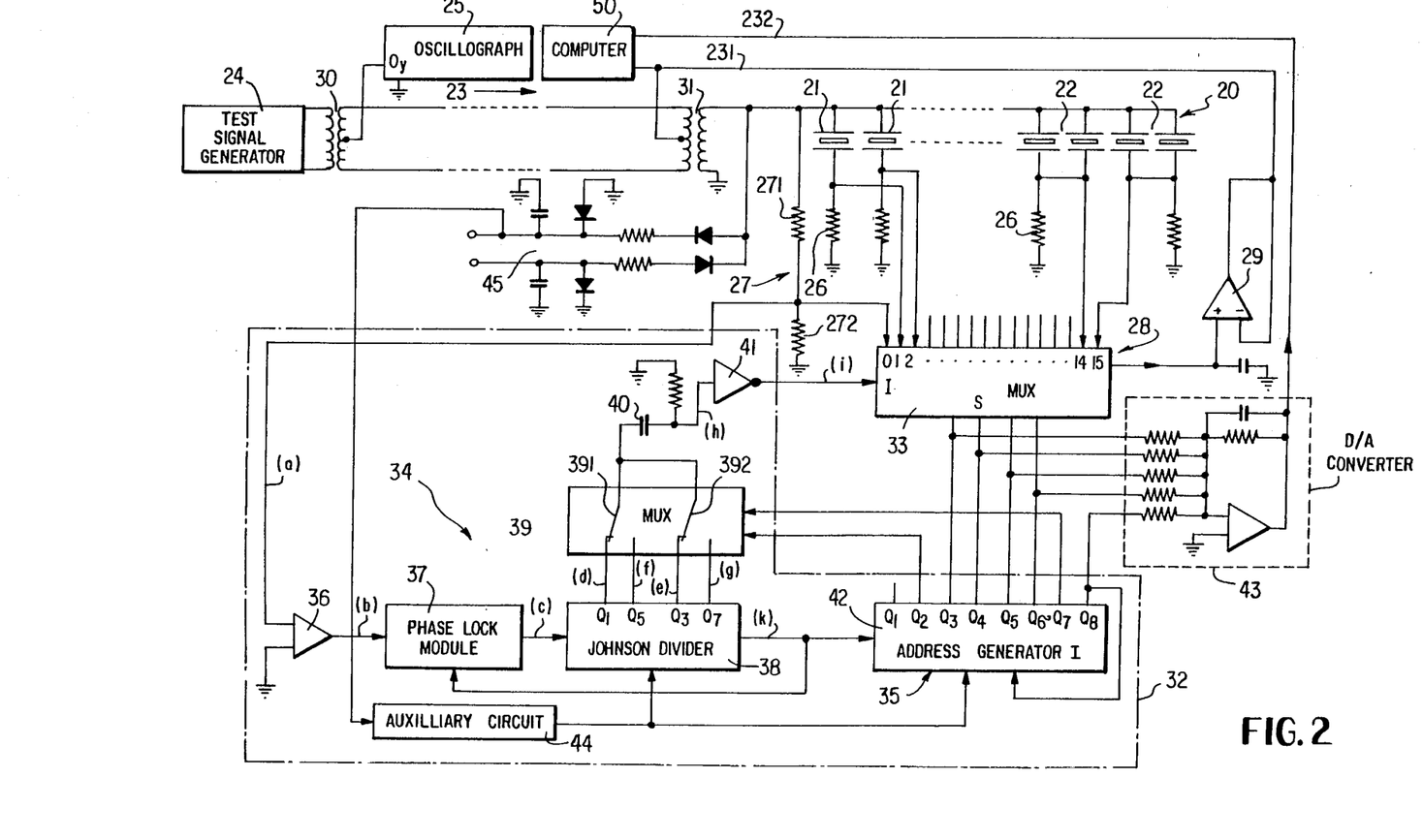
FIG. 2 is a block circuit diagram of a preferred embodiment of an apparatus according to the invention for troubleshooting an underwater acoustic transducer array according to the method of the invention.

As shown in FIG. 2, an underwater transducer array marked 20 is comprised of a plurality of spatially juxtaposed, electrically parallel connected hydroacoustic transducers 21. Transducers 21 are able to operate as transmitting and/or receiving transducers and are connected, by means of a connecting line 23, with a transmitter and/or receiver (not specifically shown here) disposed spatially remote from the underwater antenna 20. Transducers 21 may be amplitude staggered and/or electrically phase weighted in a known manner by means of a device not shown here so as to establish a direction. Instead of transducers 21, underwater transducer array 20 may also comprise a plurality of hydroacoustic transducer groups 22, so-called staves. Each transducer group 22 includes a plurality of individual transducers which are arranged transversely to the row of transducer groups and are connected in parallel with one another.

Such an above-described underwater transducer array 20 is tested as follows for possibly existing malfunctions in the transducers or transducer groups.

Figure 5:
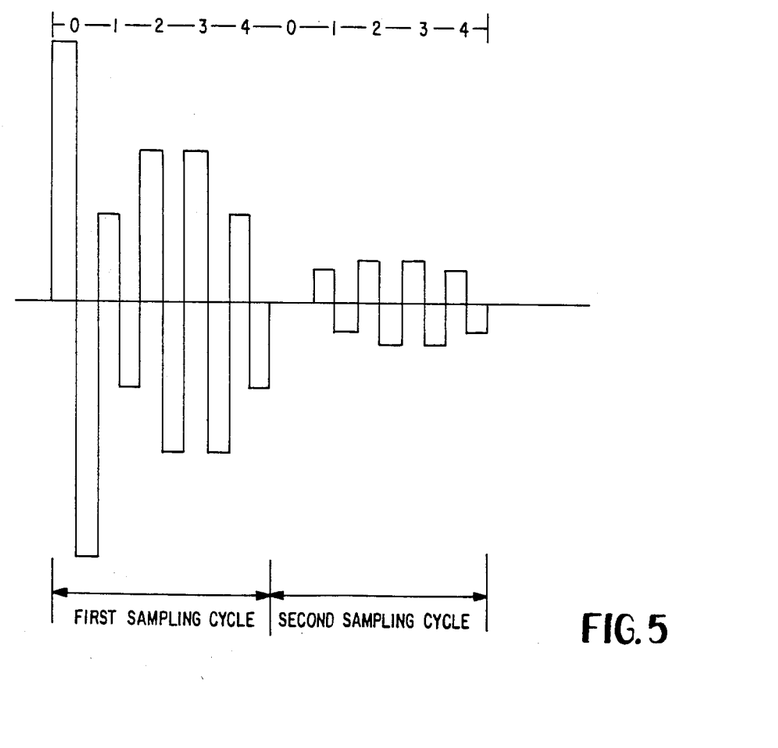
FIG. 5 is a representation on an oscillograph of the sampled values from an underwater acoustic transducer array having four juxtaposed, staggered amplitude transducers.

Over connecting line 23, an essentially sinusoidal test signal at a given frequency generated by a test signal generator 24 is fed to the transducer array 20 for a given period of time. The term sinusoidal test signal is understood to refer to signals having a sine or cosine voltage curve with a given amplitude. If a special individual test signal is to be supplied, the frequency of the test signal is preferably selected to be equal to the resonant frequency of the transducers 21 or the transducer groups 22. During the time in which the test signals are fed in, the current flowing through transducers 21 or the groups of transducers 22, or a value proportional thereto, is sampled at least twice directly at each transducer 21 or at each transducer group 22. Sampling takes place whenever the amplitude of the test signal takes on an extreme value, i.e. a minimum or a maximum. The second sampling then takes place with a shift by (4n+1) times a quarter period of the test signal, with n being any desired whole number starting with zero. To obtain a better statement, it is of advantage to repeat the above-described two samplings several times. These two sample values, one of which represents the real component and the other the imaginary component of the transducer or transducer group current, are transmitted back through connecting line 23 to the location of the test signal generation. If connecting line 23 has two conductors which are each terminated at their respective ends by transformer 30 or 31 as shown in FIG. 2, the sample values can be transmitted by means of a so-called phantom circuit through the two conductors of connecting line 23 used for feeding in the test signal. If connecting line 23 has more than two conductors, the sample values can be transmitted to the remote location over at least one separate conductor 231 of connecting line 23. The sample values may be displayed with the aid of an oscillograph 25. Such a picture displayed by an oscillograph 25 is shown in FIG. 5 for an acoustic transducer array 20 having four transducers 21.

The sequentially transmitted sample values for the transducer current or the transducer group current are now related to the extreme value, i.e. the amplitude of the test signal. The two ratios thus obtained for each transducer 21 or transducer group 22, constitute the real and imaginary components of the admittance of the respective transducer 21 or transducer group 22. If, instead of the actual transducer current, a current whose value is proportional to the actual transducer current of transducers 21 is sampled, an admittance proportional value results from which, with knowledge of the proportionality factors, the actual admittance of the transducer can easily be determined. Since the admittances of properly operating transducers 21 or transducer groups 22 are known for transducer array 20, a comparison of the actual admittances obtained by sampling with the known, desired admittances makes it possible to determine whether one of transducers 21 or one of transducer groups 22 is defective. As already mentioned above, such a defect manifests itself in a significant increase in admittance.

The amplitude of the test signal can theoretically be obtained at test signal generator 24. However, to exclude any measuring error due to transmission line attenuation, preferably a reference voltage which is rigidly in-phase with the test signal and whose amplitude is proportional to the test signal present at the transducer array input is derived from that signal. The sampling is synchronized with this reference voltage. The reference voltage is then sampled in the same manner and these sample values are transmitted back to the remote location in the same manner as described above for the sample values for the transducer or transducer group current. These sample values for the reference voltage are also displayed on oscillograph 25.

In order to exclude further measuring errors, as they may be caused, for example, by offset voltages, it is of advantage to additionally sample the reference voltage as well as the current in the individual transducers 21 or transducers groups 22 two more times, each time with a shift by one half period of the test signal with respect to the first two samplings. The ratios for determining the admittance are then obtained by using the differences between the sample values which are shifted by one-half period with respect to one another. The difference formation thus eliminates offset errors, which manifest themselves as direct voltage components so that they cannot falsify the admittance calculation.

For measuring technology reasons, the above-described method does not directly sample the current flowing through transducers 21 or transducer groups 22, but rather a value proportional thereto, i.e. the voltage drop across a load through which this current flows. To simplify the admittance determination, the effective resistance or reactance of the load is assumed to be negligibly small so that in this case an ohmic resistance or, a capacitor, for example, should be connected in series with the individual transducers 21 or transducer groups 22, respectively.

If a signal generator is already provided for operation of transducer array 20, the former can be used as the test signal generator 24. The troubleshooting test for underwater transducer array 20 can then be made on-line during the transmitting operation.

A preferred apparatus for implementing the troubleshooting method described above is shown in FIG. 2 in the form of a block circuit diagram. Each transducer 21 or transducer group 22 is connected in series with a respective measuring element 26 which here is designed as a purely ohmic resistance. However, a capacitor or an inductance can also be used as the measuring element 26. To generate a reference voltage rigidly in phase with the test signal from generator 24, a voltage divider 27 comprising two ohmic resistances 271 and 272 is provided and is connected in parallel with the parallelly connected series connections of transducers 21 or transducer groups 22 and their respective measuring elements 26, and thus in parallel with the transducer array 20.

The troubleshooting device further includes a signal pickup 28 which, at its input, sequentially detects or samples the voltage drops across the voltage divider 27 and across the measuring elements 26, and has its output connected with the input of a sample value holding member 29, which here is designed as a hold amplifier. The output of sample value holding member 29 is connected to the connecting line 23 between the transducer array 20 and the test signal generator 24. Connecting line 23 transmits the sample values present at the output of sample value holding member 29 to oscillograph 25 at the remote location where the test signal is generated. As indicated above, transmission may be effected in that the conductor 231 of connecting line 23 extends to the remote location. Alternatively, if the test signal generator 24 and connecting line 23 are galvanically decoupled from the transducer array 20 by way of transformers 30 and 31 as shown, the sample values can be transmitted from the output of sample value holding member 29 to oscillograph 25 by means of a so-called phantom circuit in that the output of sample value holding member 29 is connected with the center tap of the primary winding of transformer 31 and the y input of oscillograph 25 is connected with the center tap of the secondary winding of transformer 30.

A pickup synchronizing device 32 synchronizes pickup 28 with the reference voltage present across voltage divider 27 so that momentary voltage values for the voltages present across voltage divider 27 and measuring elements 26 are alternatingly present at least once at sample value holding member 29 if the reference voltage reaches a maximum and/or a minimum during a first sampling cycle and then, during the second sampling cycle, are shifted with respect thereto by (4n+1)

times the value of its quarter period, where n is any desired whole number starting with zero.

FIG. 5 shows the results of two such sampling cycles as they appear on an oscillograph for a transducer array 20 having four transducers 21. The sample values from the first sampling cycle are generated in that the reference voltage (0) across voltage divider 27 and the voltage drops (1 through 4) across the measuring elements 26 of four parallel connected transducers 21 are sampled at the voltage maximum of the reference voltage, with the successive associated sampling values being picked up each time with a shift with respect to one another of one half-period of the reference voltage. These sample values represent the real component of the voltages. During the second sampling cycle, the imaginary components of the voltage drops are detected. The sequence of the sampling cycles can of course also be reversed.

In the embodiment illustrated in FIG. 2, pickup 28 is designed as a multiplexer 33, e.g. integrated circuit (IC) type CD 4053 or CD 4067, having an inhibit input I and a control input S. Pickup synchronizing device 32 includes a control pulse generator 34 and an address generator 35 synchronized therewith. The output of control pulse generator 34 and the output of address generator 35 are connected respectively with the inhibit input I and with the control input S of multiplexer 33.

In detail, the voltage tap of voltage divider 27 is connected with a comparator 36 which switches at zero. The output of comparator 36 is connected with the input of a phase locking module 37, e.g. IC type CD 4046. This phase locking module 37 generates an output signal at eight times the frequency of the input signal. The output of phase locking module 37 is connected with the input of a Johnson divider 38, e.g. IC type CD 4022. The pulse present at the input of Johnson divider 38 can be obtained at its eight Q outputs with a respective phase shift of 45°. Moreover, at its output, Johnson divider 38 furnishes a carry pulse at a keying ratio of 1:1 and at a frequency which corresponds to one eighth of the input frequency. The output of Johnson divider 38 is returned, on the one hand, to phase locking module 37 and is connected, on the other hand, with address generator 35. Of the eight Q outputs of Johnson divider 38, only the odd outputs $Q_1$, $Q_3$, $Q_5$, $Q_7$ are being used, so that the output pulses at these outputs are shifted in phase by 90° with respect to one another. The Q outputs of Johnson divider 38 are connected with a multiplexer 39, e.g. of IC type CD 4052, whose output is connected, via a differentiating member 40 and an inverter 41, with the inhibit input I of multiplexer 33. The structure of this multiplexer 39 is shown schematically in the block circuit diagram. By way of its control input, multiplexer 39 is controlled in such a manner that only switch 391, which switches between $Q_1$ and $Q_5$, is effective during the first sampling cycle and only switch 392, which switches between $Q_3$ and $Q_7$ is effective during the second sampling cycle. The signal curves across voltage divider 27 (and consequently at the input of comparator 36) and at the outputs of certain of the individual components of control pulse generator 34 are shown schematically in FIG. 3, i.e. at the voltage tap of voltage divider 27(a), at the output of comparator 36(b), at the output of phase locking module 47(c), at outputs $Q_1$, $Q_3$, $Q_5$, $Q_7$ of Johnson divider 38(d-g), at the carry output of Johnson divider 38 and thus at the input of address generator 35(k), at the output of differentiating member 40(h), and at the inhibit input I of multiplexer 33(i) for the case where the $Q_1$ output of Johnson divider 38 is connected with the input I of multiplexer 33.

Address generator 35 is designed as a binary counter 42, e.g. IC type CD 4520. Of the eight Q outputs of binary counter 42, the $Q_1$ output is left open so as to obtain the double sampling rate, i.e. a sampling at which the voltage values across measuring elements 26 and voltage divider 27 are sampled not once but twice at the stated sampling times. The $Q_2$ output and the $Q_7$ output of binary counter 42 serve to control multiplexer 39. The $Q_3$ to $Q_6$ outputs furnish the addresses for multiplexer 33 and are connected with the address inputs of the latter, which form, in particular, the control input S of multiplexer 33. The $Q_8$ output of binary counter 42 is returned to its inhibit input I. The last bit from binary counter 42 thus causes binary counter 42 to be set back.

Figure 4:
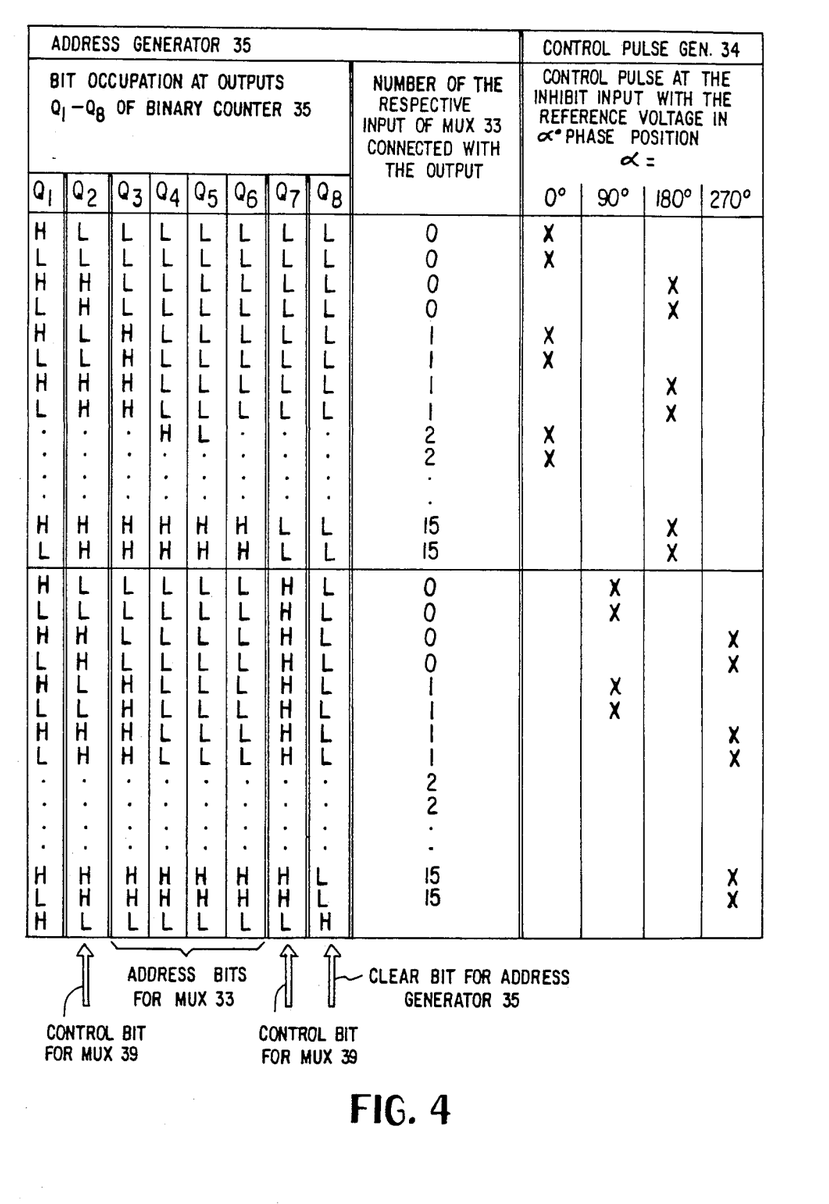
FIG. 4 shows the control scheme for a pickup synchronizing device for the phase correct control of the pickup of FIG. 2.

The control scheme for the pickup synchronizing device 32 including address generator 35 and control pulse generator 34 is shown in FIG. 4 and does not require further explanation. The control scheme is set up for a transducer array 20 having fifteen parallel transducers 21 or parallel transducer groups 22. Each input 1 through 15 of multiplexer 33 is connected with the voltage tap of the respective one of the voltage dividers formed by the series connection of a measuring element 26 and a transducer 21 or a transducer group 22. Input 0 is connected with the divider tap of voltage divider 27. For transducer arrays having a larger number of transducers 21 or transducer groups 22, respectively, multiplexer 33 must be enlarged correspondingly and correspondingly also binary counter 42.

To decode the counter contents of binary counter 42, the $Q_3$ to $Q_6$ outputs and the $Q_8$ output of binary counter 42 are connected with a digital/analog converter 43 whose output is connected with a further, separate conductor 232 of connecting line 23. This separate conductor 232 may be connected, for example, with the x input of a recording device displaying a recording in cartesian coordinates, where the y input of this recording device should then be connected with conductor 231 which is connected with the output of sampling value holding member 29. An auxiliary circuit 44 serves to reset binary counter 42 and Johnson divider 38 to zero after reaching a minimum voltage which is derived from a small power supply 45 and is defined after the onset of test signal feeding. The auxiliary circuit 44 may consist of a Schmitt trigger and a monostable multivibrator, both connected in series. Such a series arrangement is realized, e.g., by an integrated circuit of the type SN 74121 of Texas Instruments Incorporated.

Figure 3:
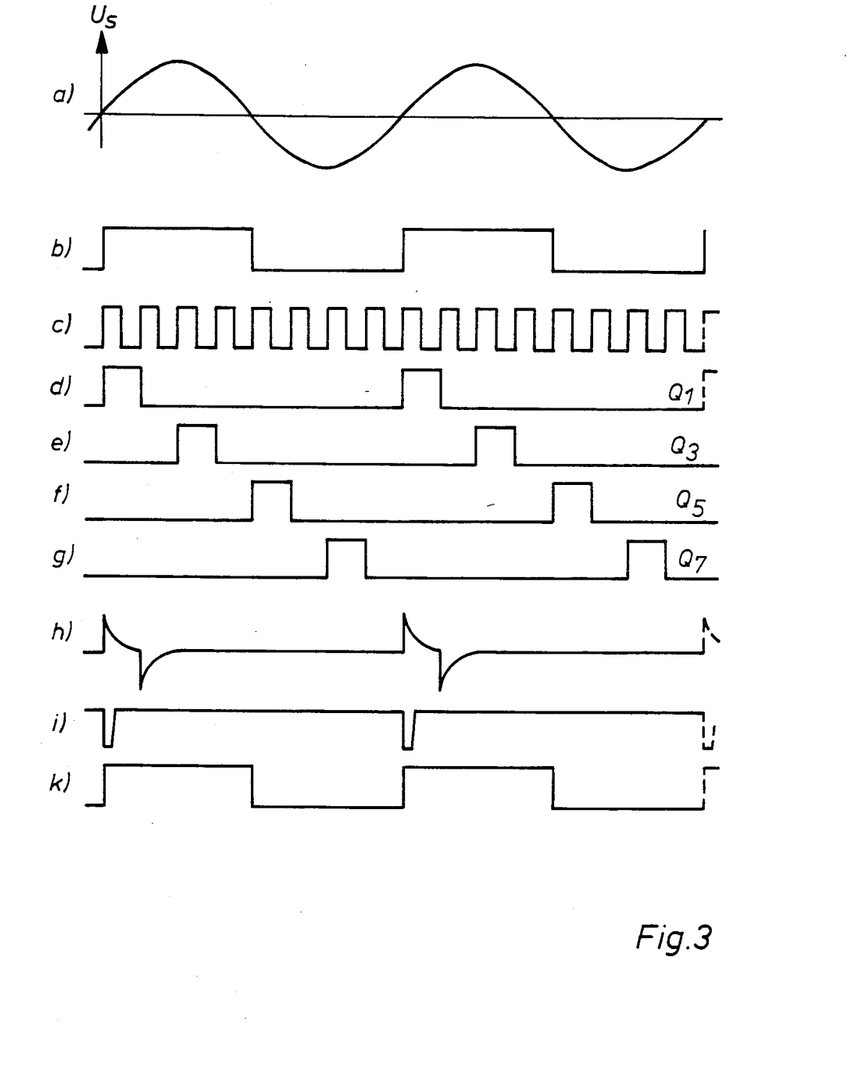
FIG. 3 is a diagram showing the time sequences of the input voltage and output voltages of some of the components of the synchronizing device 32 of FIG. 2.

The operation of the above-described troubleshooting device can easily be seen in FIGS. 3 and 4.

Test signal generator 24 generates a sinusoidal test signal at a circular frequency $\omega$. This test signal is coupled, via transformer 30, with the two conductors of connecting line 23 forming a symmetrical line and is fed, via transformer 31, to the transducer array input and thus to transducers 21 or transducer groups 22, respectively, and voltage divider 27. In comparator 36, the sinusoidal reference voltage (FIG. 3a) is converted into a rigid-phase rectangular voltage (FIG. 3b). As soon as a signal appears at the inhibit input I of multiplexer 33 (FIG. 3i), the voltage value present across one of inputs 0 to 15 of multiplexer 33 is momentarily switched through to sampling value holding member 29. This voltage value is amplified and transmitted back over connecting line 23 to the location where the test signals are generated. This value is present at the output of sampling value holding member 29 until multiplexer 33 switches the next voltage sampling value through to sampling value holding member 29.

As can easily be understood with the aid of the control scheme of FIG. 4 and the voltage curve of FIG. 3, in a first sampling cycle the voltage across input 0 of multiplexer 33 is initially sampled four times, i.e. twice during the zero passage of the reference voltage and twice with a phase shift thereto by 180°. Input 0 of multiplexer 33 is connected with the voltage tap of voltage divider 27. In this way, the reference voltage is sampled four times, with the first two sampling values representing the imaginary component of the reference voltage in the first and third quadrants and the next two sampling values representing the imaginary component of the reference voltage in the second and fourth quadrants. The phase shift by 180° between the samplings is produced in that multiplexer 39 is switched, by way of the $Q_2$ output of binary counter 42, from its $Q_1$ output to its $Q_5$ output (logic L and logic H, respectively). Then the voltage drop across measuring element 26 associated with the first transducer 21 or the first transducer group 22 is sampled and then all other measuring elements 26.

After $4 \times 16 = 2^6$ samplings, the logic state of the $Q_7$ output of binary counter 42 changes from L to H. Thus, switch 392, which alternatingly connects outputs $Q_3$ and $Q_7$ of Johnson divider 38, becomes effective and the other switch, 391, becomes ineffective. Now, input 0 of multiplexer 33 is initially connected with sample value holding member 29. The control pulse at the inhibit input I of multiplexer 33 is now generated on the basis of the effective second switch of multiplexer 39 in synchronism with the occupation of the $Q_3$ and $Q_7$ outputs of Johnson divider 38, i.e., as shown in FIGS. 3d through 3g, with a shift of 90° with respect to the first samplings. Thus the reference voltage is initially sampled four times, first twice at the voltage maximum of the reference voltage and twice at the voltage minimum. Then the voltage drops across the fifteen measuring elements 26 are each sampled four times in the same manner, again twice at the maximum of the reference voltage and twice at the minimum. These values correspond to the real components of the corresponding voltages in the first and third quadrants and in the second and fourth quadrants, respectively.

The differences between the 180° shifted, associated sampling values from measuring elements 26 from the first and second sampling cycle are now put into a relationship with the differences of the 180° shifted associated sampling values of the reference voltage from the second cycle. The ratios represent values which are proportional to the imaginary and real component, respectively, of the admittance of the individual transducers. With the correct selection of the proportionality factors, the imaginary and real components of the admittance of the fifteen different transducers can be obtained directly. These values can be compared with the known admittance values of these fifteen transducers, either directly or after vectorial addition. If there is a significant deviation between the actual value and the desired value, a malfunction exists in the respective transducer. The thus localized malfunctioning transducer can then be exchanged. The determination of the actual admittance of the transducers or groups of transducers will be carried out by an operator by measuring the sampling values shown on the recording device, e.g. on the oscillograph 25 (FIG. 5), and by calculating and drawing the relation-values into an orthogonal coordinate system.

For this purpose the operator measures the peak to peak distance of the sampling values of the reference voltage ("0" in FIG. 5) and the peak to peak distance of all sampling values from the measuring elements 26 from the first and second sampling cycle ("1" to "4" in FIG. 5). The peak to peak distance of successive sampling values from the same measuring element 26 respectively from the reference voltage represents the difference between the 180° shifted, associated sampling values. Then the operator divides each peak to peak distance from the measuring elements 26 by the peak to peak distance from the reference voltage. These results, the so-called relation-values, are drawn in the orthogonal coordinate system, and with the relation-values from the first sampling cycle in FIG. 5 on the one-axis and the relative values from the second sampling cycle in FIG. 5 on the other axis. The connection line from the point of intersection of two associated relation-values from both sampling cycles to the origin of the coordinates represents the actual admittance of the associated transducer or transducer group at the test signal frequency. FIG. 1 shows the admittance of one transducer at the frequency $\omega_0$.

Of course, all these operations or steps of method for the determination of the actual admittance of the transducers may be carried out by a computer 50 which receives the sampling values as inputs via the line 231.

Advisably, the resistance values of measuring elements 26, which are designed as ohmic resistances, are much smaller than the impedances of transducers 21 or transducer groups 22, respectively. If the transmitted signal of a transducer array 20 operating in the transmitting mode is used itself as the test signal, the resistance values are selected in such a manner that the voltage drop in the transmitting voltage occurring across measuring elements 26 lies in the order of magnitude of 100 mV to 5 V. Voltage divider 27 is dimensioned in such a manner that this maximum value, which is available at the divider tap and represents the voltage amplitude, is substantially greater than the greatest voltage drop occurring across the individual measuring elements 26. Voltage divider 27 is likewise preferably designed as a pure effective resistance. If this is not possible, the phase shift caused by the impedance of the voltage divider must be considered in the calculation of the admittance.

Measuring elements 26 may also be designed, for example, as capacitors. In that case, in the first sampling cycle, the above described device initially samples the real components and then, in the second sampling cycle, the imaginary components of the respective voltages across voltage divider 27 and measuring elements 26 and these are transmitted back over connecting line 23. This sampling result is shown in FIG. 5 for an underwater acoustic transducer array having four transducers 21 or transducer groups 22, respectively.

If the test signal frequency is variable, the entire locus of the actual admittance of all transducers 21 or transducer groups 22 can be measured.

The above-described apparatus for troubleshoooting an underwater acoustic transducer array is advisably integrated in the transducer array and is also enclosed by the transducer array covering member. Preferably, the already existing transmitter is used as the test signal generator. Such an underwater transducer array is disclosed, e.g., in U.S. Pat. No. 4,380,808, issued Apr. 19, 1983.

It will be understood that the above description of the present invention is susceptible to various modifications, changes and adaptations, and the same are intended to be comprehended within the meaning and range of equivalents of the appended claims.

What is claimed is:

1. Method for troubleshooting an underwater transducer array comprising a plurality of spatially juxtaposed, hydroacoustic transducers or transducer groups which are connected, by way of an electrical connecting line, with a transmitter and/or receiver disposed at spatially remote locations, said method comprising the steps of: feeding at least one essentially sinusoidal test signal at a given frequency to the transducer array through the connecting line; sampling the current flowing through each transducer or transducer group, or a value proportional to said current, at least twice directly at each transducer or transducer group to provide at least one first sample value taken when the test signal present at the transducer array input takes on an extreme value and at least one second sample value taken with a shift by (4n+1) times one quarter period of the test signal, with n being any desired whole number starting with zero; transmitting the first and second sample values sequentially back through the connecting line to the remote location; and, at the remote location, utilizing said first and second sample values for each transducer or transducer group and a value corresponding to said extreme value of said test signal to determine the admittance of the respective transducer or transducer group, at said test signal frequency, whereby a change in admittance between the determined admittance and the known desired admittance is an indication of a possible malfunction of the associated transducer or transducer group.

2. A method as defined in claim 1 wherein said step of utilizing includes: forming the ratio between said first and second sample values and said value corresponding to said extreme value of said test signal to provide values corresponding to the real and imaginary components of the admittance of a respective transducer or transducer group at said test signal frequency.

3. A method as defined in claim 2 wherein said value corresponding to said extreme value of said test signal utilized to determine said admittance is obtained at the input of the transducer array.

4. A method as defined in claim 3 further comprising: deriving a reference voltage which is proportional to and rigidly in-phase with said test signal from said test signal present at the input of the transducer array; synchronizing said sampling with said reference voltage; sampling said reference voltage in the same manner as said transducer currents to provide first and second sample values and transmitting said sample values of said reference voltage back to the remote location; and using the largest sample value with respect to magnitude of said reference voltage as said value corresponding to said extreme value of said test signal to obtain said ratios.

5. A method as defined in claim 4, further comprising using the deviation from zero of the smallest sample value, with respect to magnitude, of said reference voltage as a monitoring value for any deviation from the correct-phase sampling.

6. A method as defined in claim 4, wherein: said current, or said value proportional to said current, respectively and said reference voltage are each sampled at least twice more, each shifted in-phase by one half-period of the reference voltage with respect to the associated first two samplings; and the differences between the initial sample values for the current, or the current proportional value, and for the reference voltage and the respective sample values shifted by one-half period are used to determine said ratios.

7. A method as defined in claim 1 wherein said value corresponding to said extreme value of said test signal utilized to determine said admittance is obtained at the input of the antenna.

8. A method as defined in claim 7 further comprising: deriving a reference voltage which is proportional to and rigidly in-phase with said test signal from said test signal present at the input of the transducer array; synchronizing said sampling with said reference voltage; sampling said reference voltage in the same manner as said transducer currents to provide first and second sample values and transmitting said sample values of said reference voltage back to the remote location; and using the largest sample value with respect to magnitude of said reference voltage as said value corresponding to said extreme value of said test signal to obtain said admittance.

9. A method as defined in claim 8, further comprising using the deviation from zero of the smallest sample value, with respect to magnitude, of said reference voltage as a monitoring value for any deviation from the correct-phase sampling.

10. A method as defined in claim 8, wherein: said current, or said value proportional to said current, respectively and said reference voltage are each sampled at least twice more, each shifted in-phase by one half-period of the reference voltage with respect to the associated first two samplings; and the differences between the initial sample values for the current, or the current proportional value, and for the reference voltage and the respective sample values shifted by one-half period are used to determine said admittance.

11. A method as defined in claim 1 wherein a value proportional to the transducer current is sample; and wherein the current proportional value sampled is the voltage drop across a respective load through which flows at least part of the respective transducer or transducer group current.

12. A method as defined in claim 11 wherein the effective resistance or reactance of each load is approximately zero at the test signal frequency.

13. A method as defined in claim 1 wherein said test signal frequency is equal to the resonant frequency of the transducers.

14. A method as defined i claim 1 wherein, for an underwater transducer array operating as a transmitting array, the transmitted signals are simultaneously used as said test signals.

15. A method as defined in claim 1 further comprising determining a plurality of admittance values at respectively changed test signal frequencies for each transducer or transducer group to obtain the admittance locus for the transducers and transducer groups.

16. Apparatus for troubleshooting an underwater transducer array comprising: an underwater transducer array including a plurality of spatially juxtaposed parallelly connected hydroacoustic transducers; a multiconductor connecting line connecting said transducer array to a remote location; a test signal generator disposed at said remote location and connected to said underwater array via said multiconductor connecting line for providing a sinusoidal test signal; a respective measuring element connected in series with each of said transducers or with each group of said transducers, and having a negligibly low reactance or effective resistance; means, including a voltage divider connected in parallel with the series connections of said measuring elements and transducers, for generating a reference voltage which is in-phase with said test signal; a sampling value holding member having its output connected to said connecting line so as to transmit sample values to said remote location via said connecting line, a signal pickup means for sequentially sampling the voltage drops across said voltage divider and said measuring elements and for supplying the sampled values to the input of said sampling value holding member; and a pickup synchronizing means for synchronizing said signal pickup means with said reference voltage such that momentary voltage values of the voltages appearing across said voltage divider and across said measuring elements appear in succession at said sampling value holding member at least once in a first sampling cycle whenever said reference voltage reaches a maximum or a minimum, said at least once in a second sampling cycle which is shifted by $(4n+1)$ times the quarter period of said reference voltage where n is any desired whole number starting with zero.

17. The apparatus as defined in claim 16 wherein each of said measuring elements is a resistor or a capacitor.

18. Apparatus as defined in claim 16, wherein: said signal pickup means is a multiplexer having an inhibit input (I) and a control input (S); and said pickup synchronizing means includes a control pulse generator whose input is connected to the output of said means for generating a reference voltage and whose output is connected to said inhibit input (I) of said multiplexer, and an address generator which is synchronized with said control pulse generator and has address outputs which are connected with said control input (S) of said multiplexer.

19. Apparatus as defined in claim 18, wherein said address generator is a binary counter having a plurality of outputs ($Q_1$ to $Q_8$), with a portion ($Q_3$ to $Q_6$) of said outputs forming said address outputs for said multiplexer and being connected with respective address inputs of said control input (S) of said multiplexer; and wherein said address outputs ($Q_3$ to $Q_6$) of said binary counter are further connected with the inputs of a digital/analog converter whose output is connected to a separate conductor of said connecting line for transmission to said remote location.

20. Apparatus as defined in claim 16 wherein the impedance values of said measuring elements are much smaller than the impedances of said transducers.

21. Apparatus as defined in claim 20 wherein said impedance values of said measuring elements are dimensioned such that for a test signal corresponding to a transmitted signal of the underwater transducer array in transmitting operation, the respective voltage drop across each said measuring element lies in an order of magnitude of 100 mV to 5 V.

22. Apparatus as defined in claim 16 wherein said voltage divider is dimensioned such that the maximum voltage amplitude to be obtained at the divider tap of said voltage divider is substantially greater than the greatest voltage drop across each said measuring element.

23. Apparatus as defined in claim 16, wherein said voltage divider is a pure real impedance.

24. Apparatus as defined in claim 16 further comprising means for galvanically decoupling said test signal generator, said connecting line and said underwater transducer array, said means for galvanically decoupling including a first transformer having a primary winding connected to the output of said test signal generator and a center tapped secondary winding connected across the respective ends of a pair of conductors of said connecting line, and a second transformer having a center tapped primary winding connected across the other ends of said pair of conductors and a secondary winding connected to said transducer array; and wherein said output of said sampling value holding member is connected with the center tap of said primary winding of said second transformer, and the center tap of said secondary winding of said first transformer is connected to a means for detecting the transmitted sampled values.

* * * * *